United States Patent
Sarin et al.

(10) Patent No.: US 9,165,681 B2
(45) Date of Patent: *Oct. 20, 2015

(54) APPLYING A VOLTAGE-DELAY CORRECTION TO A NON-DEFECTIVE MEMORY BLOCK THAT REPLACES A DEFECTIVE MEMORY BLOCK BASED ON THE ACTUAL LOCATION OF THE NON-DEFECTIVE MEMORY BLOCK

(71) Applicant: MICRON TECHNOLOGY, INC., Boise, ID (US)

(72) Inventors: Vishal Sarin, Saratoga, CA (US); Dzung H. Nguyen, Fremont, CA (US); William H. Radke, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/224,543

(22) Filed: Mar. 25, 2014

(65) Prior Publication Data

US 2014/0204693 A1 Jul. 24, 2014

Related U.S. Application Data

(63) Continuation of application No. 13/894,543, filed on May 15, 2013, now Pat. No. 8,705,299, which is a continuation of application No. 12/274,426, filed on Nov. 20, 2008, now Pat. No. 8,446,787.

(51) Int. Cl.
*G11C 7/00* (2006.01)
*G11C 29/04* (2006.01)
*G11C 29/00* (2006.01)

(52) U.S. Cl.
CPC .............. *G11C 29/04* (2013.01); *G11C 29/808* (2013.01); *G11C 29/82* (2013.01); *G11C 29/848* (2013.01)

(58) Field of Classification Search
USPC ............................................. 365/200, 185.09
See application file for complete search history.

(56) References Cited

U.S. PATENT DOCUMENTS

| | | | |
|---|---|---|---|
| 8,295,109 B2 | 10/2012 | Sarin et al. | |
| 8,446,787 B2 * | 5/2013 | Sarin et al. | 365/200 |
| 8,705,299 B2 * | 4/2014 | Sarin et al. | 365/200 |
| 2001/0038554 A1 | 11/2001 | Takata et al. | |
| 2004/0233720 A1 | 11/2004 | Imamiya et al. | |
| 2006/0013048 A1 | 1/2006 | Kim | |
| 2007/0165466 A1 * | 7/2007 | Lehmann et al. | 365/200 |
| 2008/0052445 A1 | 2/2008 | Kim et al. | |

(Continued)

FOREIGN PATENT DOCUMENTS

| | | |
|---|---|---|
| KR | 10-0536491 | 12/2005 |
| WO | WO 2006/086703 A1 | 8/2006 |

(Continued)

OTHER PUBLICATIONS

Non-Final Office Action dated Jun. 15, 2010 in U.S. Appl. No. 12/272,138 (13 pgs.).

*Primary Examiner* — Anthan Tran
(74) *Attorney, Agent, or Firm* — Dicke, Billig & Czaja, PLLC

(57) ABSTRACT

In an embodiment, a defective memory block is replaced with a non-defective memory block, and a voltage-delay correction is applied to the non-defective memory block that replaces the defective memory block based on the actual location of the non-defective memory block.

20 Claims, 3 Drawing Sheets

(56) References Cited

U.S. PATENT DOCUMENTS

2009/0116317 A1* 5/2009 Kim ............................ 365/200
2010/0124132 A1 5/2010 Sarin et al.

FOREIGN PATENT DOCUMENTS

| WO | WO 2007-041185 A2 | 4/2007 |
| WO | WO 2008/121535 A1 | 10/2008 |

* cited by examiner

APPLYING A VOLTAGE-DELAY CORRECTION TO A NON-DEFECTIVE MEMORY BLOCK THAT REPLACES A DEFECTIVE MEMORY BLOCK BASED ON THE ACTUAL LOCATION OF THE NON-DEFECTIVE MEMORY BLOCK

RELATED APPLICATIONS

This application is a continuation of U.S. application Ser. No. 13/894,543, titled "REPLACING DEFECTIVE MEMORY BLOCKS IN RESPONSE TO EXTERNAL ADDRESSES," filed May 15, 2013 and issued as U.S. Pat. No. 8,705,299 on Apr. 22, 2014, which is a continuation of U.S. application Ser. No. 12/274,426, titled "REPLACING DEFECTIVE MEMORY BLOCKS IN RESPONSE TO EXTERNAL ADDRESSES," filed Nov. 20, 2008 and issued as U.S. Pat. No. 8,446,787 on May 21, 2013, both of which are commonly assigned and incorporated in their entirety herein by reference.

FIELD

The present disclosure relates generally to memory devices and in particular the present disclosure relates to replacing defective memory blocks in response to external addresses.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as trapping layers or other physical phenomena (which is sometimes referred to as writing), determine the data value of each cell. Common uses for flash memory include personal computers, personal digital assistants (PDAs), digital cameras, digital media players, cellular telephones, and removable memory modules.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a data line, such as column bit line.

The memory array is accessed by a row decoder activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the column bit line to the source line through each NAND string via the corresponding select gates, restricted only by the selected memory cells of each string. This places the current-encoded data values of the row of selected memory cells on the column bit lines.

A memory device is usually placed in communication with a controller, such as a processor, a host controller, or other external host device via an input/output interface, e.g., to form part of an electronic system. The memory device receives control signals, command signals (which are sometimes referred to as commands), address signals (which are sometimes referred to as addresses), and data signals (which are sometimes referred to as data) from the controller and outputs data to the controller.

Defects can occur during the manufacture of a memory array having rows and columns of memory cells, resulting in defective rows or columns. This problem is commonly solved by incorporating redundant elements in the memory that selectively replace defective elements. Redundant rows are a common form of redundant elements used in flash memory to replace defective primary rows. For example, for NAND flash memory arrays, blocks of redundant rows (commonly referred to as a redundant blocks) replace defective blocks of primary rows (commonly referred to as a primary blocks).

Redundant blocks are typically located in a different portion of a memory array than the primary blocks. Generally, redundancy circuitry is used to selectively route access requests directed to the defective primary blocks to the redundant blocks located in a different portion of the array. Some memory devices, including some flash memory devices, utilize non-volatile registers to store addresses of primary blocks that are designated to be replaced. Address requests from the host controller are compared to the addresses of the defective primary blocks stored in the registers at the memory device, e.g., by the redundancy circuitry. If an address request matches an address of a defective primary block stored in the register, the redundancy circuitry directs or maps the access request to the redundant block instead of the defective primary block.

The process of replacing a defective primary block with a redundant block is typically transparent to the host controller in that the host controller does not know the address it sends to the memory device is an address of a defective block. That is, the host controller believes it is accessing a memory block at a location in the memory array (the location of the defective block) corresponding to the address that the host controller sends to the memory device. Instead, the host controller is accessing a redundant block located at a different location within the array.

There is typically a voltage delay along the length of a word line when a voltage is applied to the word line due to resistive and capacitive effects (commonly referred to as an RC delay). The RC delay increases with increasing distance from the end of the word line to which the voltage is applied, e.g., from the end closest to the row decoder. Moreover, there is typically a voltage delay along the bit line, with the delay increasing with increasing distance along the bit line from a sense amplifier.

In some instances, the host controller may be programmed to compensate for the voltage delay at a memory cell due to the distance of the memory cell from the row decoder and/or the sense amplifier. However, problems can occur if the block containing memory cells that are being compensated for is a defective block whose address is mapped to a redundant block located at a different location in the array. This is because the host controller is programmed to compensate for the delay based on the location of the defective memory block within the array and not on the location of the redundant block. That is, the compensation will be applied to the memory cells in the redundant block as though they were located at the location of the defective block.

For the reasons stated above, and for other reasons stated below which will become apparent to those skilled in the art upon reading and understanding the present specification, there is a need in the art for alternative redundancy schemes.

DETAILED DESCRIPTION

Figure 1:
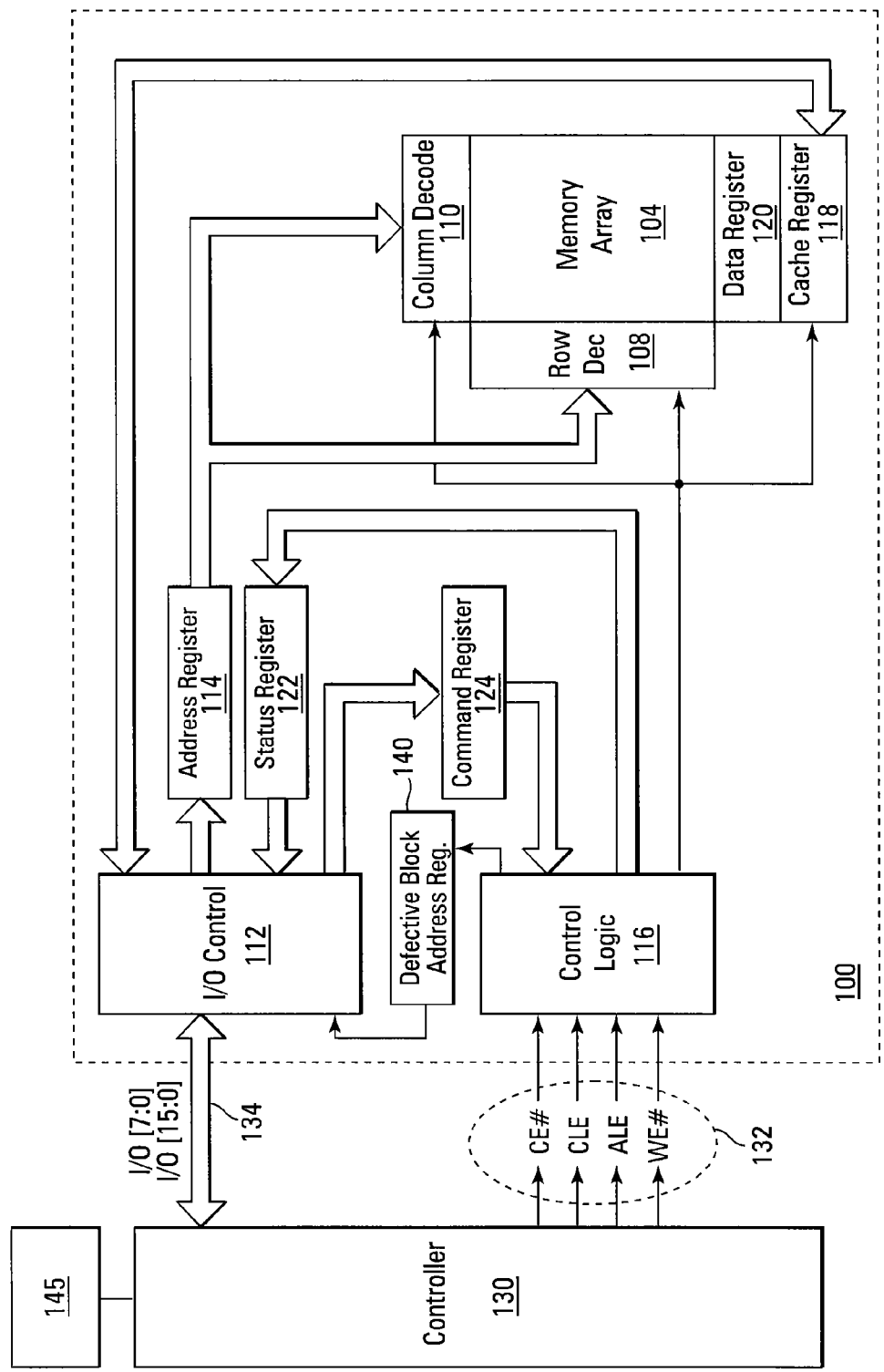
FIG. 1 is a simplified block diagram of an embodiment of an electronic system, according to an embodiment of the disclosure.

In the following detailed description, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present disclosure. The following detailed description is, therefore, not to be taken in a limiting sense, and the scope of the present disclosure is defined only by the appended claims and equivalents thereof.

FIG. 1 is a simplified block diagram of a NAND flash memory device 100 coupled to a controller 130 as part of an electronic system, such as a personal digital assistant (PDA), digital camera, digital media player, cellular telephone, etc., according to an embodiment. The controller 130 may be a processor, memory controller, or other external host device. Memory device 100 includes an array of memory cells 104 arranged in rows and columns. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. For one embodiment, control circuitry 112 is configured to manage output of the addresses of one or more defective blocks of memory cells, e.g., containing one or more defective rows of memory cells, of memory array 104 to controller 130.

An address register 114 is coupled between I/O control circuitry 112 and row decoder 108 and column decoder 110 to latch the address signals prior to decoding. A command register 124 is coupled between I/O control circuitry 112 and control logic 116 to latch incoming commands. Control logic 116 controls access to the memory array 104 in response to the commands and generates status information for the controller 130. The control logic 116 is coupled to row decoder 108 and column decoder 110 to control the row decoder 108 and column decoder 110 in response to the addresses.

Control logic 116 is also coupled to a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the controller 130; then new data is passed from the data register 120 to the cache register 118. A status register 122 is coupled between I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which are sometimes referred to as commands), address signals (which are sometimes referred to as addresses), and data signals (which are sometimes referred to as data) from controller 130 over a multiplexed input/output (I/O) link 134 (which is sometimes referred to as an I/O bus) and outputs data to controller 130 over I/O link 134.

Specifically, the commands are received over input/output (I/O) pins [7:0] of I/O link 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

For one embodiment, a defective block address register 140 is coupled between I/O control circuitry 112 and control logic 116. Defective block address register 140 is configured to store the addresses of one or more defective blocks of memory cells of memory array 104, e.g., that respectively have one or more defective rows of memory cells. During operation, defective block address register 140 latches the addresses of the one or more defective blocks, e.g., at least partially in response to receiving a signal from control logic 116, to I/O control circuitry 112 for subsequent output to controller 130 over input/output (I/O) link 134. For one embodiment, the addresses of the one or more defective blocks are output to controller 130 at least partially in response to memory device 100 powering up. For another embodiment, control logic 116 sends a signal to defective block address register 140 when control logic 116 determines that memory device is powered up.

It will be appreciated by those skilled in the art that additional circuitry and control signals can be provided, and that the memory device of FIG. 1 has been simplified to help focus on the invention. Additionally, while specific I/O pins are described in accordance with popular conventions for receipt and output of the various signals, it is noted that other combinations or numbers of I/O pins may be used in the various embodiments.

Figure 2:
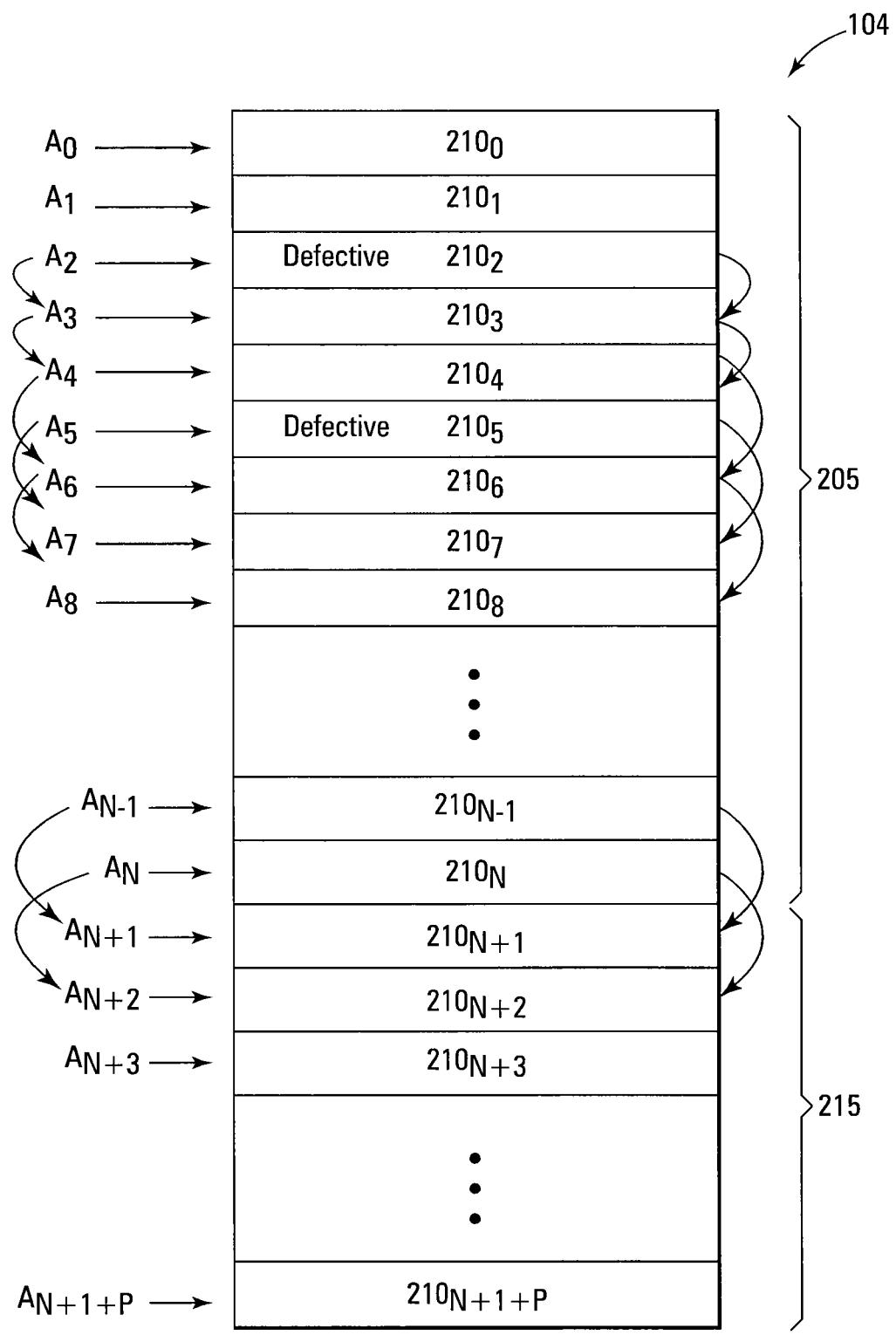
FIG. 2 illustrates an embodiment of a memory array, according to another embodiment of the disclosure.

FIG. 2 illustrates memory array 104, according to an embodiment. Memory array 104 includes a primary memory array 205 with sequential primary memory blocks $210_0$ to $210_N$ and an additional (e.g., a redundant) array 215 with additional (e.g., redundant) sequential memory blocks $210_{N+1}$ to $210_{N+1+P}$, where the additional memory blocks are used only when one or more of the primary blocks are defective. Primary memory blocks $210_1$ to $210_N$ respectively have sequential block addresses $A_0$ to $A_N$, and additional sequential memory blocks $210_{N+1}$ to $210_{N+1+P}$ respectively have block addresses $A_{N+1}$ to $A_{N+1+P}$.

The physical distances of memory blocks $210_0$ to $210_{N+1+P}$ from a reference location within the memory array, such as block $210_0$ at the top of the array, sequentially increase as their respective addresses $A_0$ to $A_{N+1+P}$ sequentially increase from address $A_0$. For example, the larger the block address, the larger the distance of the block from block $210_0$. For example, since address $A_3$ is larger than address $A_2$, memory block $210_3$ is at a greater distance from memory block $210_0$ than memory block $210_2$. In other words, the sequential addresses $A_0$ to $A_{N+1+P}$ respectively specify the sequential order of memory blocks $210_0$ to $210_{N+1+P}$ within the memory array, starting with address $A_0$ of memory block $210_0$.

In the event that one or more of primary memory blocks 210 are determined to be defective, e.g., have one or more defective rows, the addresses of the defective blocks can be stored in defective block address register 140 (FIG. 1). For example, addresses $A_2$ and $A_5$ are stored in defective block address register 140 (e.g., during the manufacture of memory device 100) when primary blocks $210_2$ and $210_5$, respectively having addresses $A_2$ and $A_5$, are determined to be defective, such as during testing, e.g., during the manufacture of memory device 100. Addresses $A_2$ and $A_5$ of defective primary blocks $210_2$ to $210_5$ are then sent to controller 130 via input/output (I/O) control circuitry 112 and input/output (I/O) link 134, e.g., upon power up of memory device 100. For one embodiment, controller 130 may store the addresses of the defective blocks in a volatile memory (e.g., a volatile register) 145, for example, that may be removably coupled to controller 130.

Controller 130 may be configured to compare addresses of blocks 210 to the addresses of the defective blocks stored in volatile memory 145. For example, controller 130 may compare an address to be sent to memory device 100, to the addresses of the defective blocks stored in volatile memory 145. Controller 130 may be further configured to replace the address to be sent to memory device 100 with the address of, a proximate, e.g., the first, non-defective block in the block sequence following a defective block that is available to replace the defective block, e.g., that has not been used previously as a replacement block, when the address to be sent to the memory controller matches the address of that defective block. Controller 130 may be also configured to replace each of the addresses, to be sent to memory device 100, of non-defective blocks succeeding the address of the defective block with the address of the next available non-defective block following that non-defective block in the block sequence. Controller may keep track of the addresses it has replaced so that it does not try to use an address that is already been used as a replacement.

For one embodiment, when controller 130 encounters address of a defective block, controller 130 increments the address to the address of a proximate non-defective block following the defective block in the block sequence. For example, when controller 130 encounters address $A_2$ of defective block $210_2$, controller 130 increments the address $A_2$ by one address to address $A_3$ of non-defective block $210_3$, the first available non-defective block in the block sequence following defective block $210_2$, as shown in FIG. 2, and the succeeding address $A_3$ by one address to address $A_4$, the address of the next non-defective block $210_4$ in the block sequence available for replacement, e.g., that has not been used previously as a replacement block. Since address $A_5$ is the address of a defective block $210_5$, address $A_4$ is incremented by two addresses to address $A_6$ of non-defective block $210_6$, the next available non-defective block in the block sequence following defective block $210_5$, e.g., that has not been used previously as a replacement block. Address $A_5$ is incremented by two addresses to address $A_7$, the address of the next available non-defective block $210_7$ in the block sequence following defective block $210_5$, e.g., that has not been used previously as a replacement block, (note, block $210_6$ is not the next available non-defective block of the block sequence in that it replaces block $210_4$). Incrementing the addresses continues until address $A_{N-1}$ is incremented by two addresses to address $A_{N+1}$ of non-defective additional block $210_{N+1}$, and address $A_N$ is incremented by two addresses to address $A_{N+2}$ of non-defective additional block $210_{N+2}$. Note that the address space A[0:N] of the primary array 205 is expanded to A[0:N+2] to accommodate for defective blocks $210_2$ and $210_5$. That is, the address space is shifted up by the number of addresses of defective blocks.

After sequentially incrementing the addresses as described above, controller 130 sends the incremented addresses to memory device 100. An address incremented from an address of a defective block can be used to address a proximate, e.g., the first available, non-defective block in the block sequence following the defective block in place of the defective block so that the proximate non-defective block replaces the defective block. For example, after incrementing address $A_2$ of defective block $210_2$ to address $A_3$ of non-defective block $210_3$, address $A_3$ can be used to address non-defective block $210_3$ in place of defective block $210_2$, thus replacing defective block $210_2$ with non-defective block $210_3$. This means that controller 130 instructs memory device 100 to access non-defective block $210_3$ in place of defective block $210_2$.

To accommodate for the block replacement, each of the non-defective blocks sequentially following the defective block is replaced by the next available non-defective block in the block sequence. For example, after incrementing address $A_3$ of non-defective block $210_3$ to address $A_4$ of non-defective block $210_4$, address $A_4$ can be used to address non-defective block $210_4$ in place of non-defective block $210_3$, thus replacing non-defective block $210_3$ with non-defective block $210_4$. Since block $210_5$ is defective, non-defective block $210_4$ is replaced by non-defective block $210_6$, the next available non-defective block in the block sequence, so that non-defective block $210_6$ can be accessed in place of non-defective block $210_4$. For example, after incrementing address $A_4$ of non-defective block $210_4$ to address $A_6$ of non-defective block $210_6$, address $A_6$ can be used to address non-defective block $210_6$ in place of non-defective block $210_4$, thus replacing non-defective block $210_4$ with non-defective block $210_6$. Similarly, defective block $210_5$ is replaced by non-defective block $210_7$, non-defective block $210_6$ by non-defective block $210_8$, and so on until non-defective block $210_N$ is replaced by non-defective additional block $210_{N+2}$.

Figure 3:
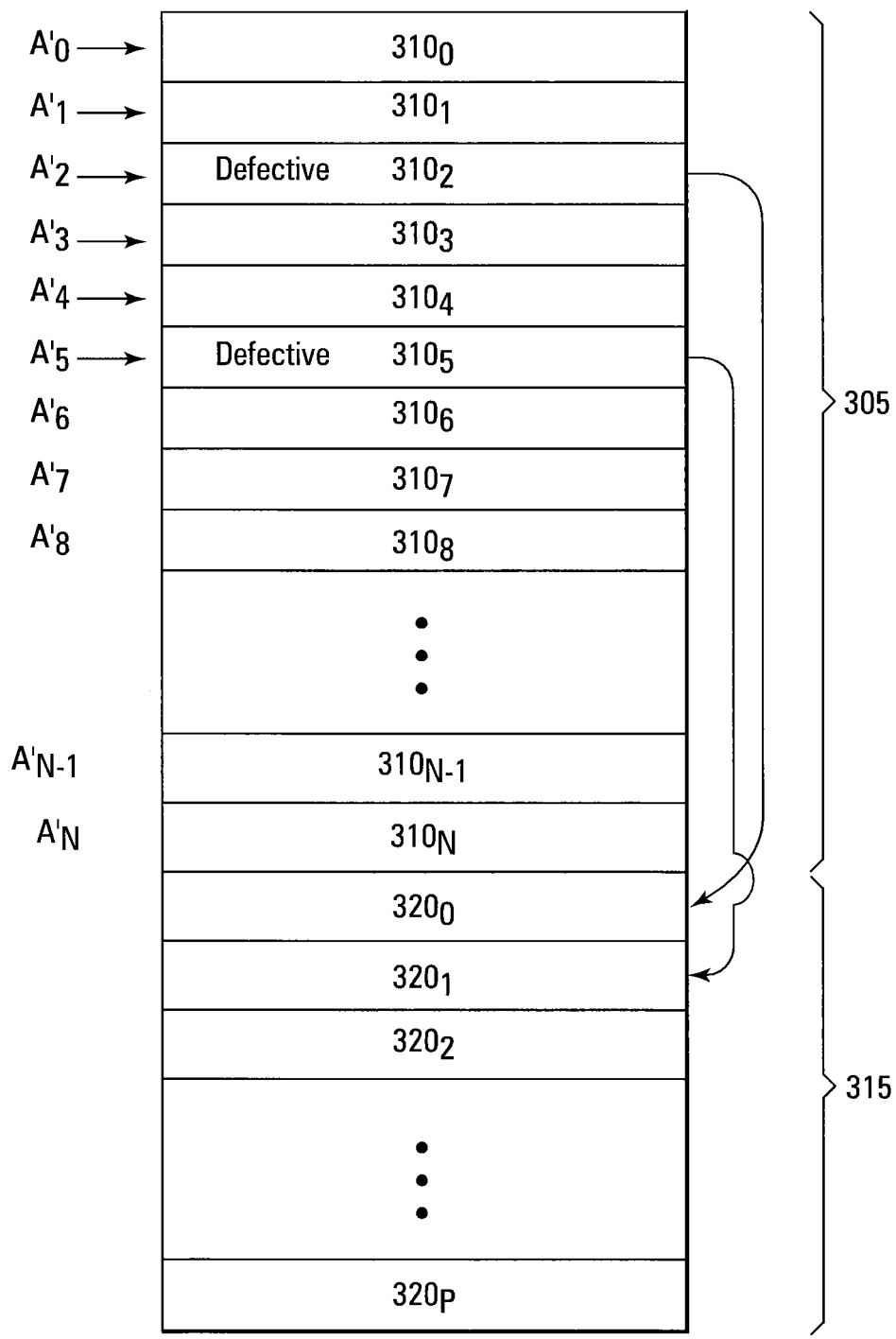
FIG. 3 illustrates a memory array of the prior art.

Note that the scheme of replacing a defective block by the next available non-defective block in the block sequence following the defective memory block, e.g., in a direction away from a reference block in the memory array, such as the top block having the first address in the address sequence, differs from conventional redundancy schemes in that the replacement blocks are closer to the defective blocks they replace. For example, in a conventional redundancy scheme of the prior art, shown in FIG. 3, defective blocks in primary array 305, e.g., defective blocks $310_2$ and $310_5$, are respectively replaced by redundant blocks $320_0$ and $320_1$ of redundant array 315 in response to a controller sending addresses $A'_2$ and $A'_5$ to memory device 100. However, defective blocks $310_2$ and $310_5$ are further from their replacement blocks $320_0$ and $320_1$ than defective blocks $210_2$ and $210_5$ are from their replacement blocks $210_3$ and $210_7$ (FIG. 2).

Note that for some memory devices, the controller corrects for voltage delays along the data lines, such as bit lines, (e.g., column lines), according to the location of the block within the array. This means that for the prior art redundancy scheme of FIG. 3, the controller will apply the correction to redundant blocks $320_0$ and $320_1$ according to the respective locations of defective blocks $310_2$ and $310_5$. However, for the embodiment of the replacement scheme of FIG. 2, the controller, for one embodiment, will apply the correction to the non-defective blocks $210_3$ and $210_7$, e.g., by sending a signal to memory device 100 to apply the correction, according to the respective locations of defective blocks $210_2$ and $210_5$.

It is expected that the further a replacement block is from the defective block it replaces, the larger the error in the voltage delay correction applied to the replacement block. Since non-defective blocks $210_3$ and $210_7$ are closer to defective blocks $210_2$ and $210_5$ than redundant blocks $320_0$ and $320_1$ are to defective blocks $310_2$ and $310_5$, it is expected that the error in the voltage delay correction applied to non-defective blocks $210_3$ and $210_7$ is less than the error in the voltage delay correction applied to redundant blocks $320_0$ and $320_1$.

For another embodiment, controller 130 can apply a voltage correction to the replacement blocks, e.g., by sending a signal to memory device 100 to apply the correction, according to their actual location since controller 130 knows the location of those blocks. That is, instead of applying the correction to the replacement blocks as though the replacement blocks were located at the blocks they replace, the controller can apply the correction to the replacement blocks based on their actual locations. For example, instead of applying the correction to the non-defective blocks $210_3$ and $210_7$ according to the respective locations of defective blocks $210_2$ and $210_5$, the correction can be applied to non-defective blocks $210_3$ and $210_7$ according to their actual locations.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments. It is manifestly intended that the embodiments be limited only by the following claims and equivalents thereof.

What is claimed is:

1. A method of operating a memory device, comprising:
    replacing a defective memory block with a non-defective memory block; and
    applying a voltage-delay correction to the non-defective memory block that replaces the defective memory block based on the actual location of the non-defective memory block.

2. The method of claim 1, wherein the non-defective memory block is a memory block that follows the defective memory block in a sequence of memory blocks and that is available to replace the defective memory block.

3. The method of claim 1, wherein the non-defective memory block is a first available non-defective memory block following the defective memory block in a sequence of memory blocks.

4. The method of claim 3, further comprising replacing the first available non-defective memory block within the sequence of memory blocks with a next available non-defective memory block within the sequence of memory blocks.

5. The method of claim 3, wherein the next available non-defective memory block within the sequence of memory blocks that replaces the first available non-defective memory block is in a redundant memory array of the memory device.

6. The method of claim 1, wherein replacing the defective memory block with the non-defective memory block is in response to receiving an address that addresses the non-defective memory block in place of the defective memory block.

7. The method of claim 6, wherein receiving the address that addresses the non-defective memory block in place of the defective memory block comprises receiving an address that is larger than the address of the defective memory block.

8. The method of claim 1, further comprising sending an address of the defective block to a controller and receiving an address that addresses the non-defective memory block in place of the defective memory block from the controller.

9. The method of claim 8, wherein sending the address of the defective block to the controller comprises sending the address of the defective block to the controller upon power up of the memory device.

10. The method of claim 8, wherein the address of the defective memory block is stored on the memory device.

11. The method of claim 1, wherein applying the voltage-delay correction to the non-defective memory block is in response to receiving a signal from a controller.

12. A memory device, comprising:
    a plurality of memory blocks;
    wherein the memory device is configured to replace a defective memory block of the plurality of memory blocks with a non-defective memory block of the plurality of memory blocks; and
    wherein the memory device is configured to apply a voltage-delay correction to the non-defective memory block that replaces the defective memory block based on the actual location of the non-defective memory block.

13. The memory device of claim 12, wherein the memory device is configured to replace the defective memory block with the non-defective memory block in response to receiving an address that addresses the non-defective memory block in place of the defective memory block.

14. The memory device of claim 13, wherein the memory device is configured to send an address of the defective block to a controller and to receive the address that addresses the non-defective memory block in place of the defective memory block from the controller.

15. The memory device of claim 14, further comprising a register that stores an address of the defective memory block.

16. The memory device of claim 14, wherein the address of the defective memory block is stored in the memory device during manufacture of the memory device.

17. The memory device of claim 12, wherein the memory device is configured to apply the voltage-delay correction in response to receiving a signal from a controller.

18. A memory device, comprising:
    a sequence of memory blocks;
    wherein the memory device is configured to replace a defective memory block in the sequence of memory blocks with a first available non-defective memory block in the sequence of memory blocks;

wherein the memory device is configured to replace the first available non-defective memory block in the sequence of memory blocks with a next available non-defective memory block in the sequence of memory blocks; and wherein the memory device is configured to apply a voltage-delay correction to the first available non-defective memory block based on the actual location of first available non-defective memory block and/or to apply a voltage-delay correction to the next available non-defective memory block based on the actual location of next available non-defective memory block.

19. The memory device of claim 18, wherein the memory device is configured to replace the defective memory block in the sequence of memory blocks with the first available non-defective memory block in the sequence of memory blocks in response to receiving an external address that is incremented from an address of the defective memory block to an address of the first available non-defective memory block.

20. The memory device of claim 18, wherein the memory device is configured to replace the first available non-defective memory block in the sequence of memory blocks with the next available non-defective memory block in the sequence of memory blocks in response to receiving an external address that is incremented from the address of the first available non-defective memory block to an address of the next available non-defective memory block.

* * * * *